United States Patent
Siala et al.

(10) Patent No.: US 11,146,745 B2
(45) Date of Patent: Oct. 12, 2021

(54) ELECTRONIC DEVICES HAVING DISPLAYS WITH INFRARED COMPONENTS BEHIND THE DISPLAYS

(71) Applicant: Array Photonics, Inc., Tempe, AZ (US)

(72) Inventors: Sabeur Siala, Sunnyvale, CA (US); Philip Dowd, Gilbert, AZ (US)

(73) Assignee: ARRAY PHOTONICS, INC., Tempe, AZ (US)

(*) Notice: Subject to any disclaimer, the term of this patent is extended or adjusted under 35 U.S.C. 154(b) by 0 days.

(21) Appl. No.: 16/811,639

(22) Filed: Mar. 6, 2020

(65) Prior Publication Data

US 2020/0288070 A1 Sep. 10, 2020

Related U.S. Application Data

(60) Provisional application No. 62/815,502, filed on Mar. 8, 2019.

(51) Int. Cl.
*H01L 27/32* (2006.01)
*H01L 31/18* (2006.01)
*H01L 27/146* (2006.01)
*H04N 5/33* (2006.01)
*G01S 17/89* (2020.01)
*H01S 5/183* (2006.01)
*G01S 7/4865* (2020.01)

(52) U.S. Cl.
CPC ............ *H04N 5/33* (2013.01); *G01S 17/89* (2013.01); *H01S 5/183* (2013.01); *G01S 7/4865* (2013.01)

(58) Field of Classification Search
None
See application file for complete search history.

(56) References Cited

U.S. PATENT DOCUMENTS

| 6,277,668 B1 * | 8/2001 | Goossen | H01S 5/0262 438/69 |
| 6,568,812 B2 | 5/2003 | Magocs | |
| 6,798,809 B1 | 9/2004 | Gambin | |
| 7,645,626 B2 | 1/2010 | Ha | |

(Continued)

FOREIGN PATENT DOCUMENTS

| CN | 208924293 U | 5/2019 |
| EP | 2857885 A1 | 4/2015 |

(Continued)

OTHER PUBLICATIONS

Kwon, J. H., et al. "High-Performance Organic Light-Emitting Diode Displays." Applications of Organic and Printed Electronics Springer, Boston, MA, 2013. 57-81.

(Continued)

*Primary Examiner* — Alison Slater
(74) *Attorney, Agent, or Firm* — Morrison & Foerster LLP

(57) ABSTRACT

An electronic device having a display with an infrared component (such as a camera, a light source) behind the display. The layer of the display is transparent to infrared light at which the infrared component operates. Infrared sensing functions, when implemented by the component, may be accomplished by transmission of infrared light through the layer of the display, thereby removing the conventional need for cut-outs or holes in the display plane and maximizing the display area.

19 Claims, 7 Drawing Sheets

(56) References Cited

U.S. PATENT DOCUMENTS

| | | | |
|---|---|---|---|
| 7,728,316 B2 | 6/2010 | Fadell | |
| 8,154,582 B2* | 4/2012 | Border | H04N 7/144 345/50 |
| 8,202,788 B2* | 6/2012 | Yoon | H01L 21/0254 438/492 |
| 8,293,628 B2* | 10/2012 | Albo | B82Y 20/00 117/89 |
| 8,310,149 B2 | 11/2012 | Lifka | |
| 8,664,582 B2 | 3/2014 | McCarthy | |
| 9,195,127 B1 | 11/2015 | Marason | |
| 9,537,116 B2 | 1/2017 | Lamansky | |
| 9,555,561 B2 | 1/2017 | Khachatryan | |
| 9,570,002 B2 | 2/2017 | Sakariya | |
| 9,570,427 B2 | 2/2017 | Bibl | |
| 9,614,191 B2 | 4/2017 | Madigan | |
| 9,736,383 B2 | 8/2017 | Evans, V | |
| 9,741,286 B2 | 8/2017 | Sakariya | |
| 9,864,400 B2 | 1/2018 | Evans, V | |
| 9,915,974 B2 | 3/2018 | Yang | |
| 10,054,430 B2 | 8/2018 | Mor | |
| 10,170,030 B2 | 1/2019 | Perdices-Gonzalez | |
| 10,431,636 B2 | 10/2019 | Rappoport | |
| 10,445,892 B2 | 10/2019 | Alibay | |
| 10,461,743 B2 | 10/2019 | Alshine | |
| 2004/0155846 A1 | 8/2004 | Hoffman | |
| 2007/0002130 A1 | 1/2007 | Hartkop | |
| 2014/0132530 A1* | 5/2014 | Suh | G06F 3/0421 345/173 |
| 2015/0287766 A1* | 10/2015 | Kim | H01L 27/14641 250/208.1 |
| 2016/0352071 A1 | 12/2016 | Hogan | |
| 2016/0352073 A1 | 12/2016 | Dummer | |
| 2017/0090581 A1* | 3/2017 | Pothier | G06F 3/017 |
| 2017/0176753 A1* | 6/2017 | Shi | G02F 1/1362 |
| 2017/0211973 A1* | 7/2017 | Jia | G01J 1/4204 |
| 2017/0221976 A1 | 8/2017 | Park | |
| 2017/0249522 A1 | 8/2017 | Lee | |
| 2017/0310086 A1 | 10/2017 | Barve | |
| 2017/0364172 A1* | 12/2017 | Kim | G02B 5/208 |
| 2018/0069060 A1 | 3/2018 | Rappoport | |
| 2018/0213071 A1* | 7/2018 | Bao | H04M 1/0264 |
| 2018/0228409 A1* | 8/2018 | Kim | A61B 5/7278 |
| 2019/0104625 A1* | 4/2019 | Rogers | H04M 1/0264 |

FOREIGN PATENT DOCUMENTS

| | | |
|---|---|---|
| EP | 3605520 A2 | 2/2020 |
| WO | 2019067553 A1 | 4/2019 |

OTHER PUBLICATIONS

Nishino, S, et al. "A feasibility study of gender recognition with a near-infrared ray scanning spectrophotometer." Electronics and Communications in Japan 94.9 (2011): 59-68.

Vogel, U., et al. "Near-to-eye displays with embedded eye-tracking by bi-directional OLED microdisplay." Optical Systems Design 2015: Optical Design and Engineering VI. vol. 9626. International Society for Optics and Photonics, 2015.

Wu, T., et al. "Mini-LED and micro-LED: promising candidates for the next generation display technology." Applied Sciences 8.9 (2018): 1557.

U.S. Appl. No. 62/793,557, filed Jan. 17, 2019, Roucka, et al.

* cited by examiner

ELECTRONIC DEVICES HAVING DISPLAYS WITH INFRARED COMPONENTS BEHIND THE DISPLAYS

CROSS-REFERENCE TO RELATED APPLICATIONS

This application claims priority from the U.S. provisional patent application No. 62/815,502 filed on Mar. 8, 2019, the disclosure of which is incorporated herein by reference.

TECHNICAL FIELD

The present invention relates to electronic devices having displays and devices (and/or device component(s)) such as cameras and light sources, for example, that are configured to operate (that is, detect light, and/or generate light, and/or emit light) in the infrared portion of the wavelength spectrum and that are disposed in such devices behind the displays, as perceived by persons facing and looking at the displays. (For the purposes of this disclosure and associated claims, displays and various other devices that are configured to operate in the infrared (IR) range of wavelengths are referred to as defined as "infrared components" or "IR components".) The display plane is optically transparent in at least portions of the display plane to light at the infrared wavelengths associated with the operation and functions of infrared components. Infrared sensing functions implemented by the infrared components may be accomplished by transmission of IR light through the display plane, thereby removing or reducing the need for cut-outs, notches, or holes in the display plane and maximizing the display area.

RELATED ART

More often than not, various electronic devices (including cellular telephones, tablet computers, and other portable devices) contain displays. In a given device, the display often occupies a relatively large portion of the front surface or face of the device. Notably, however, in a conventionally designed electronic device, the display does not fill up or occupy the entire front surface. Rather, a portion of the front surface is used by additional opto-electronic components (including cameras, light sources, and other electronic or optical components), the purpose of which is to collect information from the space in front of the electronic device (ambient space, front space) and/or deliver or emanate or emit various signals towards such front space. Incorporation and operation of such opto-electronic devices in cooperation with the portion of the front surface of the hosting electronic device often presents practical challenges, unless the display portion of the electronic device is modified and/or reduced in size, or unless other design modifications (such as inclusion of more complex mechanical arrangements) are made. For example, a camera placed within a device can pop outside the mobile device when the camera is activated, as described in U.S. Pat. No. 9,736,383, the disclosure of which is incorporated herein by reference. The practical need to reduce the area of the front surface of the electronic device occupied by the display is, understandably, not particularly desired as such solution lessens at least the degree of comfort with which the user operates the electronic device.

Solutions leading to increase—if not maximization of—the area of the display in relation to the overall area of the front surface of a given electronic device are, therefore, in demand.

SUMMARY

Embodiments of the invention address methodologies of forming an electronic device with a display behind which various operational components are disposed in such a way as to maximize the useful surface of the active display while, at the same time, minimizing cross-talk between the components.

To this end, an embodiment of the invention provides a method for fabricating an electronic device having a front. The method includes forming a first layered structure of the device (where the first layered structure defines a display pixel and includes a first layer dimensioned to define an optically-active portion of the display pixel; and a second layer dimensioned to define a non-optically-active portion of the display pixel. Here, the non-optically-active portion is configured to not emit light in operation of the display). The method additionally includes the steps of constructing a functional layer of the device by disposing an array of infrared components behind the first layered structure, as seen from the front; and creating a second layered structure carrying electronic connection circuitry electrically connected to at least one of the first layered structure and the functional layer. The method additionally includes disposing the functional layer the said first layered structure in and within the bounds of a housing shell such that a chosen infrared component of the array of infrared components is positioned behind the non-optically-active portion, as seen from the front. In at least one implementation, the method satisfies at least one of the following conditions:

(i) the process of disposing includes positioning the chosen infrared component behind the non-optically-active portion that is devoid of a physical aperture that provides optical communication between a medium at the front and the chosen infrared component; (ii) the process of forming includes dimensioning the non-optically-active portion to be transparent to light at a wavelength at which the chosen infrared component either emits said infrared light or absorbs said light (that is, the utilized material is configured to have a transition from a conduction band to the valence band and—in a specific case—such transition is a direct transition); and (iii) the constructing includes constructing the functional layer to include at least one of an infrared camera, a flood illuminator, a proximity sensor, a dot projector, a speaker, a microphone, and an optical camera. In substantially any implementation of the method, at least one of the following conditions may be satisfied: (a) the process of forming includes defining both the optically-active portion and the non-optically-active portion within predetermined boundaries of the display pixel without overlapping thereof; (ii) the process of forming includes dimensioning the optically-active portion and the non-optically-active portion to be complementary to one another to define, aggregately, an overall area of the display pixel; (iii) the process of forming includes forming first and second display pixels in said first layered structure, the first pixel having both of corresponding optically-active and non-optically-active portions, the second pixel having only a corresponding non-optically-active portion; and (iv) the process of forming includes forming an array of display pixels in the first layered structure, in which an optically-active areas of display pixels in the array of display pixels are formed with a first spatial period, wherein the constructing includes disposing constituent infrared components of said array of infrared components with a second spatial period, and wherein the first and second spatial periods substantially coincide.

In substantially any implementation the method can be configured such that the process of disposing includes disposing the array of infrared components behind the first layered structure such that each of constituent infrared components of the assay of infrared components is positioned behind a non-optically-active portion of one of the display pixels in said array of display pixels, as seen from the front; and/or such that the process of forming includes forming the first layered structure having a first area, the constructing includes constructing the functional layer that includes a second area, and the first and second areas are substantially congruent or spatially matching one another. Alternatively or in addition, and in substantially any embodiment, the method may include at least one of a) forming the array of infrared components from a semiconductor material that absorbs light at wavelengths between about 1100 nm and about 1600 nm; and b) configuring said array of infrared components to operate within a spectral range chosen to ensure that said multiple infrared components operate substantially without cross-talk.

Embodiments of the invention further provide an electronic device, manufactured according to the above-identified method, that has a front and includes a housing; at least one infrared component in the housing; and a pixelated display layer in optical communication with the at least one infrared component. Here, the display layer includes an array of pixels and having at least one transmissive region that is substantially transparent to infrared light at a wavelength of interest and that is spatially coordinated with the at least one infrared component to transmit said infrared light between a medium at the front and the at least one infrared component through the at least one transmissive region.

In addition—in at least one implementation—the electronic device is structure to ensure that the at least one infrared component is configured to detect or emit infrared light in at least one of the following wavelength ranges: a) a wavelength range between about 1100 nm and about 1600 nm, and b) a wavelength range between about 1250 nm and about 1600 nm; and/or at least one infrared component includes a semiconductor laser or an optical detector; and/or at least one infrared component includes an array of vertical-cavity surface-emitting lasers (VCSELs).

In at least one implementation, the structure of such electronic device satisfies at least one of the following conditions: a) the display includes a polymer substrate or a glass substrate or a silicon substrate configured to carry the array of pixels thereon, and b) wherein the pixelated display layer is devoid of a physical aperture through or opening in said pixelated display layer in the at least one transmissive region such that the infrared light is traversing a material of the pixelated display layer while being transmitted between a medium at the front and the at least one infrared component through the at least one transmissive region. Alternatively, or in addition, the electronic device may be configured such that at least one of pixels of the array of pixels includes a non-optically-active area and wherein the non-optically-active area is substantially congruent with the at least one transmissive region.

In substantially any embodiment, at least one of the pixels of the arrays of pixels of the electronic device further may include an optically-active area (and in one specific case, such optically-active area is transparent to light at wavelengths between about 1100 nm and about 1600 nm), and at least one infrared component may be located behind said optically-active area as seen from the front. (Alternatively, or in addition, an overall area of such at least one of the pixels may be completely defined by a combination of said non-optically-active area and said optically-active area.) Optionally—in at least one embodiment—at least one infrared component may include an auxiliary optical element and/or at least one of an infrared optical camera, a flood illuminator, a dot projector, a time-of-flight sensor, and a proximity sensor.

Alternatively or in addition, and substantially in any embodiment, the electronic device may be structured to satisfy at least one of the following conditions: a) the at least one infrared component comprises a semiconductor material that absorbs light at wavelengths between about 1100 nm and about 1600 nm; and b) the at least one infrared component includes multiple infrared components configured to operate within a spectral range chosen to ensure that multiple infrared components operate substantially without cross-talk; and/or wherein the at least one infrared component includes a dilute nitride semiconductor material.

Alternatively or in addition, and substantially in any embodiment, the electronic device may allow simultaneous operation of at least one infrared component that emits or absorbs light at wavelengths between about 1100 nm and 1600 nm and the display pixels, without interference, due to the spectral separation between the visible wavelengths generated by the display and the infrared wavelengths used by the infrared components.

Further features of the invention, its nature and various advantages will be more apparent from the accompanying drawings and the following detailed description of some of the embodiments.

BRIEF DESCRIPTION OF THE DRAWINGS

The following Description is made in reference to the Drawings that are used to provide non-limiting examples of implementations of the idea of the invention, are generally not to scale, and are not intended to limit the scope of the present disclosure.

Generally, like elements and components are referred to in different drawings by like labels and/or numerals and/or terms, and not every component present in one drawing may be labelled in another related drawing for simplicity of illustration.

DETAILED DESCRIPTION

In this disclosure, the term "or" generally means "and/or" unless specifically stated otherwise.

The term "lattice-matched", or similar terms, refer to and define adjoining semiconductor layers or materials the in-plane lattice constants of which (considered in the fully relaxed states of such layers or materials) differ by less than 0.6% when such layers have thicknesses greater than 100 nm. Further, in specific devices (such as VCSELs, for example) that are structured to have multiple layers forming individual device regions (such as reflectors, for example) that are substantially lattice-matched with each other, the use of the term "lattice-matched" implies that all materials in the junctions (that are present in thicknesses greater than 100 nm and considered in their fully-relaxed states) have in-plane lattice constants that differ from one another by less than 0.6%. The terms "substantially lattice-matched" or "pseudomorphically strained" is used to refer to and define the presence of strain within a given layer (which may be not only thicker than 100 nm by may also be thinner than 100 nm) of such adjoining layers or materials. This would be understood by a skilled artisan from context of the discussion. As non-limiting examples, and depending on a particular implementation, base material layers of a given layered structure can have strain from 0.1% to 6%, from 0.1% to 5%, from 0.1% to 4%, from 0.1 to 3%, from 0.1% to 2%, or from 0.1% to 1%. In related embodiments, base material layers can have strain less than 6%, preferably less than 5%, more preferably less than 4%, even more preferably less than 3% or even less than 2%, and most preferably less than 1%. In practice, layers made of different materials that, in comparison with one another, differ in a given lattice parameter (such as a pseudomorphically-strained layers, for example) can be grown on top of other lattice-matched or strained layers without generating misfit dislocations. The term "strain" is generally used to refer to and define compressive strain and/or to tensile strain.

Figure 1:
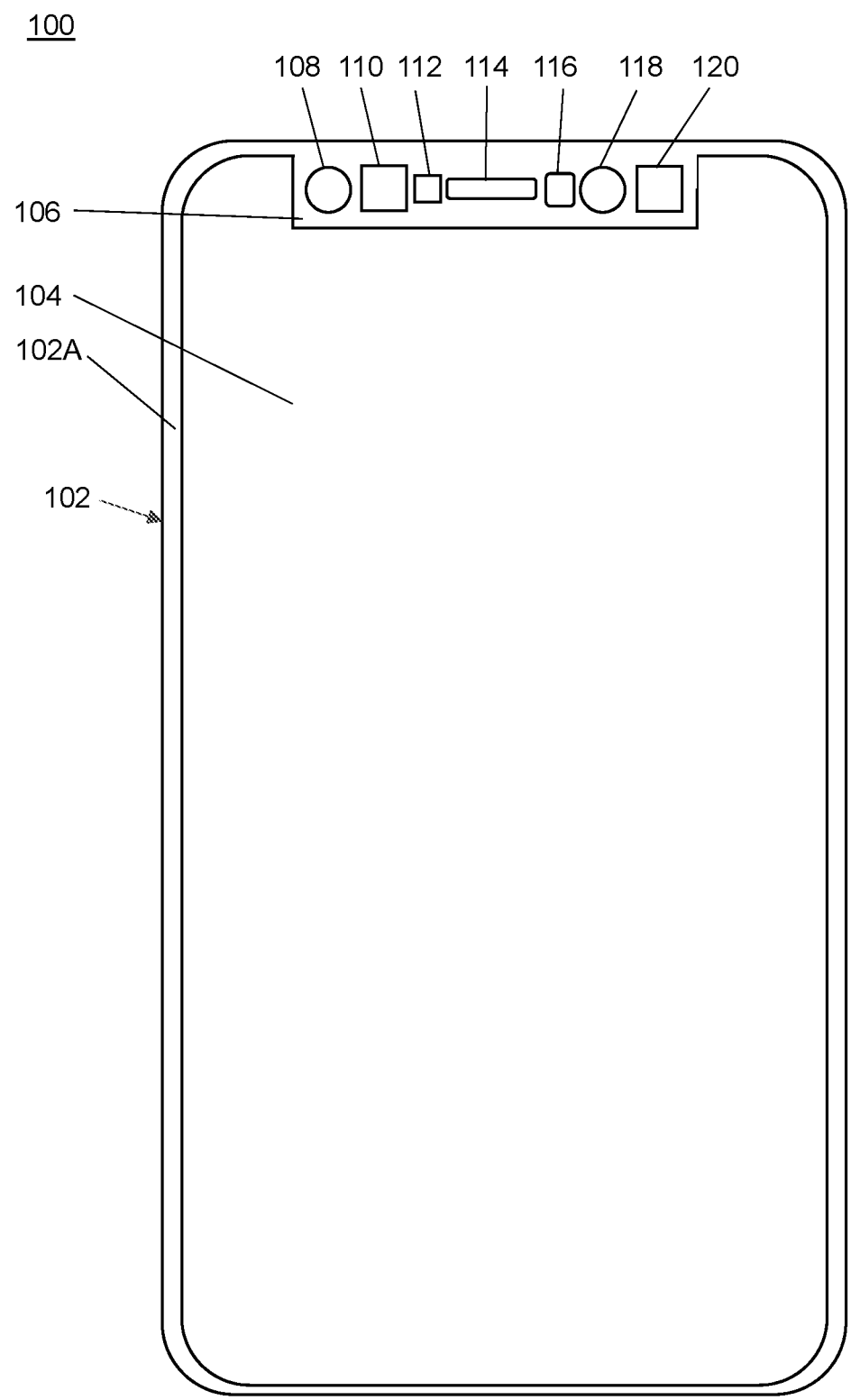
FIG. 1 shows a front view of an electronic device (having a display) of related art.

To provide some illustration, FIG. 1 is a front view of a conventional electronic device 100 that has a display 104. The shown front is the view perceived by an observer who looks at an unobstructed front surface of the device 100. Display 104 is mounted in a housing 102 with an optional peripheral portion or bezel 102A, which, in some embodiments may be disposed along a perimeter (and often—around) the display 104. Alternatively, the display 104 may be sized to extend from edge to edge of the device 100 (for example, from the outermost edge on the left to the outermost edge on the right, as viewed in FIG. 1), with the housing 102 substantially completely mounted behind the front surface. (This configuration of the device 100 is not shown in the Drawings.) Depending on the particular implementation, display 104 may be structured to include multiple material layers and areal regions including, but not limited to, a substrate, emissive material regions, electronic drive circuits, electrical interconnections, optical filters and other components used to form and effectuate the operation of pixels capable of emitting or generating light at wavelengths visible to a human eye (referred to as visible wavelengths). Owing to their material properties, some of the layers used to form the display may prevent light at certain wavelengths from being transmitted through at least a portion of the display.

To make the desired transmission possible—that is, to enable a conventionally-structured electronic device 100 to deliver signals (including optical signals) between the ambient space in front of the device 100 and the required target component(s) or sub-system(s) of the device 100, the display 104 of the conventionally-structured device is typically dimensioned to not cover the entirety of the front surface. Instead, the display 104 is dimensioned to have a perimeter that defines a (schematically-shown) cut-out region or notch 106 in the surface area of the display. The notch or cut-out region 106 is judiciously dimensioned to reduce the overall surface area of the display 104 so as to accommodate the desired target electronic components in the notch, and to allow the target component to exchange (transmit and/or receive) the sought-after signals with the ambient space in front of the device 100 without passing these signals through the display itself. The cut-out or notch 106, is specifically dimensioned to accommodate multiple electronic elements or devices into electronic device 100. Non-limiting examples of electronic components that may be included in the device 100 and are shown in FIG. 1, include infrared (IR) components such as infrared camera 108, flood illuminator 110, proximity sensor 112 and dot projector 120, as well as other electronic components such as speaker 114, microphone 116 and camera 118 operating in a visible portion of the optical spectrum. Such infrared components operate at infrared wavelengths between about 780 nm and about 1000 nm.

Figure 2:
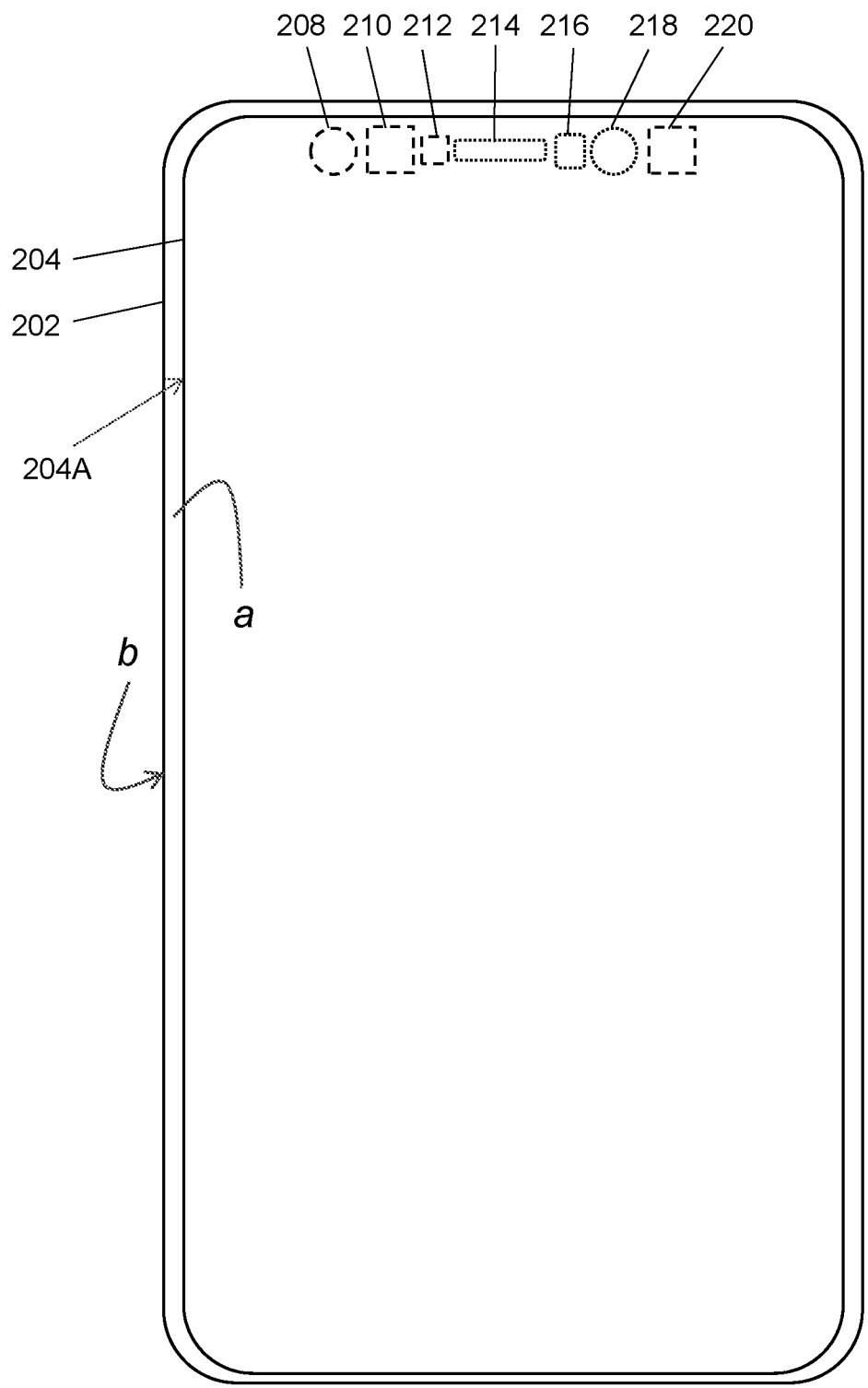
FIG. 2 shows front view of a display device having embedded infrared components.

In contradistinction to related art, FIG. 2 schematically illustrates a front view of an electronic device 200 configured according to the idea of the invention. (Depending on the specifics of the particular implementation, the device 200 may be configured as a cellular telephone, a tablet computer, a gaming device, portable computing equipment, a computer monitor, global positioning system equipment, or take form of some other electronic equipment.)

As shown, the conventionally-structured device 100, the device 200 has a housing (or a case) 202 that can be formed using plastic, metal, glass, ceramics, other suitable materials or combinations of materials.

The display 204 is mounted in the housing 202 and, as shown, the display 204 is placed within the housing 202 such that the edge portion of the housing defines a bezel 204A around the display 204. The housing 202 may encase or enclose a region of the device 200 that contains multiple components including, without limitation, electronic components and circuits, batteries and the like.

Depending on the embodiment, the width of the bezel (shown as "204A") between the visible to the user outer edge "a" of the display 204 and the point defining the outermost extent "b" of the housing 202 may be minimized by implementing a flexible display layer to form the display 204 (such as, for example, a flexible organic light-emitting-diode display layer) and by bending the peripheral portion and/or edges of the flexible display layer downwards, into the body of the housing, away from the exposed face surface of the display 204. Examples of flexible organic light emitting display layers are described in U.S. Pat. Nos. 9,614,191, 8,310,149, 9,537,116, and U.S. patent application US 2019/0051715, the disclosure of each of which is incorporated herein by reference.

Accordingly, in one embodiment the display 204 is structured to form the front surface of the device 200, overlying the housing 202. (Depending on the specifics, the display 204 may include an active region, with pixel elements devised to deliver visually-perceivable information to the observer, as well as an inactive region at the peripheral portion of the display).

In one embodiment, the display 204 is configured with the use of a touch screen that incorporates haptic sensor(s) based on, for example, capacitive sensing or other types of haptic technology (employing, e.g., resistive touch, light-based touch, acoustic touch, force-sensor-based touch, etc., as known in the art.). Alternatively or in addition, the display 204 may have an active region (defined by a display area configured to generate signals visually perceivable by the user of the device) that includes, for example pixels of any of light-emitting diodes (LEDs), micro-LEDs, organic LEDs (OLEDs), transparent organic LEDs (TOLEDs), plasma cells, electronic ink elements, liquid crystal display (LCD) components, and other suitable display pixel structures. Alternatively or in addition, and in substantially any implementation, the display 204 may include multiple layered structures and display regions configured as, for example, a substrate material, regions of light-emitting material, electronic drive circuits, electrical interconnections, optical filters and other components to aggregately form display elements (pixels) that are configured to emit or generate light, during the operation of the display, at wavelengths visible to a human eye such as to display or show various images for a user of the device 200. At least one region of the display 204 may be appropriately configured to be transparent to the IR radiation. For example, at least one region of the display that is optically-transparent can be structured to be transparent to light at wavelengths between approximately 780 nm and 1600 nm, or between approximately 1100 nm and 1600 nm, or between approximately 1250 nm and 1600 nm, or between approximately 1300 nm and 1400 nm. (In some example, the optical transparency or substantial optical transparency is defined to a feature of transmissivity of a given element measure at a level greater that 30%, or greater than 50%, or greater than 70% or even 90% at a wavelength of interest.)

The so-structured transparent display regions are appropriately spatially coordinated with the infrared optical components of the device 200, the operation of which includes light generation and light detection/sensing and that are placed behind the display (as viewed by the user of the device 200), to transmit the IR light between the (ambient) space in front of the display 204 and the infrared components without the need to remove a portion of the overlying display. In stark contradistinction with display(s) of related art, the so-formatted display 204, therefore, does not require the cut-out region or window or notch (shown as, for example, notch 106 in a conventional device 100), thereby understandably facilitating an increase in a useful display area.

Referring further to FIG. 2, the device 200 may additionally include, among others, input-output ports, buttons, sensors, status indicator lights, speakers, microphones, optical components, some or all of which may be implemented in layers underlying display layer 204 itself.

For example, the device 200 may include IR electronic components, disposed behind the display 204, such as an infrared camera 208, flood illuminator 210, proximity sensor 212 and dot projector 220, all of which operate in the IR portion of the optical spectrum to the light of which the overlying display layer 204 is transparent in at least one region of the display. These IR electronic devices may enable the device functions including proximity sensing, facial recognition, scene illumination, recognition, identification or evaluation, and gesture recognition, if required. The IR electronic components may also include different optical elements such as lenses and filters.

In a related implementation, the device 200 may also include auxiliary electronic components such as a speaker 214, a microphone 216 and a visible camera 218. These may be placed between small physical openings or holes (not shown) that are formed within the active area of display 204. Examples of electronic devices having displays with physical openings are described in U.S. Patent Publication 2018/006906, the disclosure of which is incorporated herein by reference.

Alternatively or in addition, the device 200 may also include (not shown) other elements and subsystems such as a power source (e.g. a battery), input-output circuitry allowing the phone to provide an output to a given user input (such as an audio input, or a text input), and storage, processing and communication electronic circuitry. The device 200 may be equipped with, for example, storage such as hard disk drive storage, nonvolatile non-transitory memory or other suitable storage medium. Processing electronic circuitry may be based on one or more microprocessors, power control circuitry, application-specific integrated circuits or other circuits. The storage and processing circuitry may allow software to run on the device 200, including internet browsing, email applications, media playback, photography, operating system functions and the like. Elements enabling such functional capabilities and other elements may be enclosed in the housing of device 200.

Figure 3:
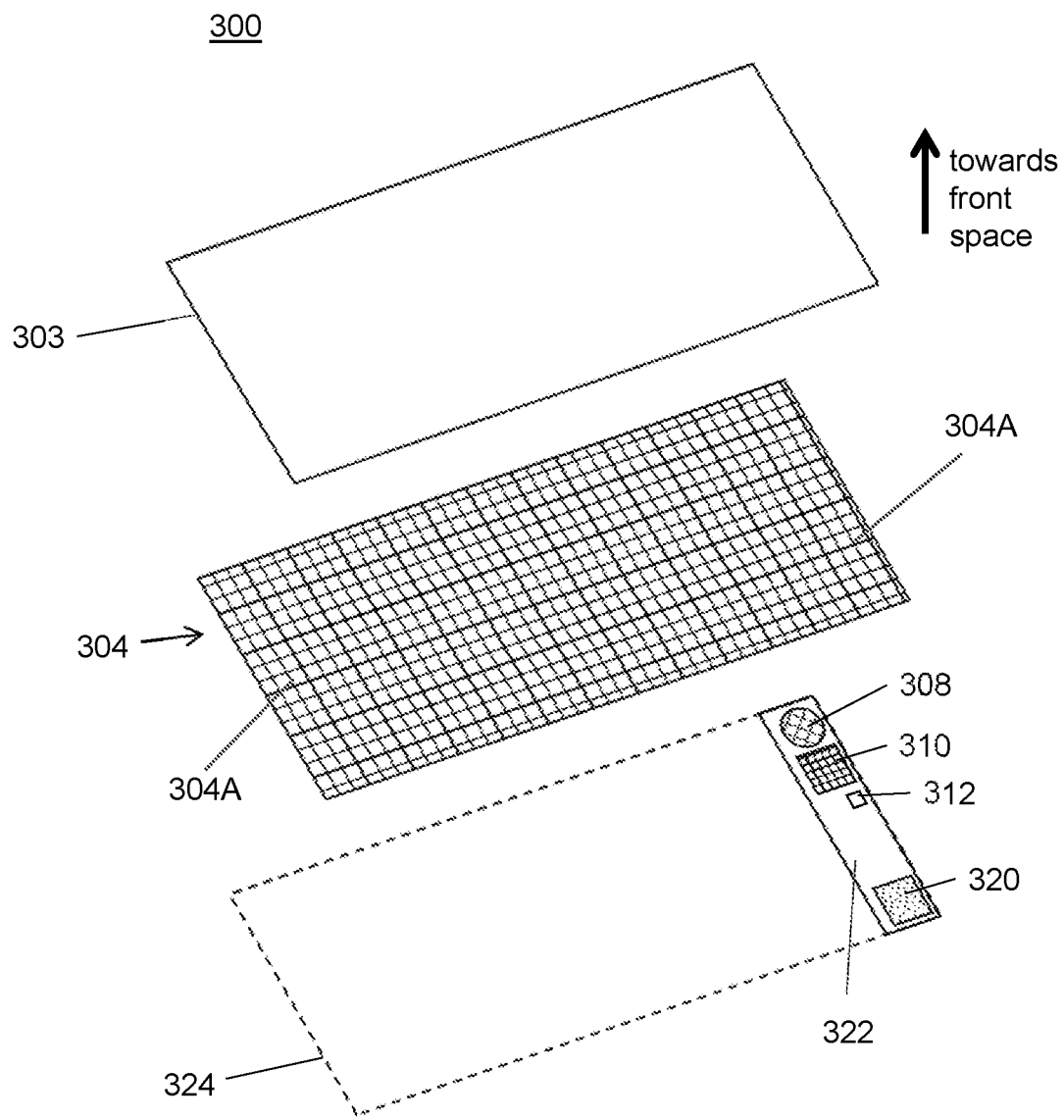
FIG. 3 provides an exploded view of layers of a display device having embedded infrared components.

FIG. 3 is an exploded view of several layers of an electronic device 300, configured according to an embodiment of the invention that has a display (behind which the IR components are installed and operated). As schematically shown, the device 300 has a display 304 (generally configured as a layered structure) with an active region having pixels 304A; the display is disposed under an optically transparent protection or housing layer 303, which is configured to transmit light at both the wavelengths of the visible portion of the optical spectrum and at infrared wavelengths. Examples of a material appropriate for fabrication of the transparent layer 303 include glasses such as Corning Gorilla® glass or Corning Willow® glass, or a transparent plastic or a layer of polyimide, or combinations of these materials. The display 304 itself may be structured as a multilayer contraption (not shown) to include multiple (sub-)layers and regions such as, for example, a substrate, an emissive material region, an electronic drive circuit, an electrical interconnection (also referred to as an interconnect), an optical filter, and other components to produce pixel regions 304A that are capable of emitting or generating light at wavelengths visible to a human eye.

As shown, underlying or behind the layered structure of the display 304 (with respect to the ambient front space) is another functional plane or level or layer 324 of the device 300, where other electronic components may be placed (and, optionally, organized in a spatial array). These components may include an infrared component, an acoustic device, a camera, a sensor, and/or storage, control and processing devices and electronic circuitry, as well as other elements of the device 300. Notably, the simplified schematic view of FIG. 3 illustrates only a portion 322 of the underlying plane or layer 324, which carries an infrared camera 308, a flood illuminator 310, a proximity sensor 312, and a dot projector 320. In one example, the infrared components 308, 310, 312 and 320 are devised to emit, absorb, and/or process IR light at wavelengths between about 1100 nm and 1600 nm. (The remaining portion of the functional layer 324, generally is also at least partially filled with the desired electronic components.) In some examples, elements 308, 310, 312 and 320 may be configured to emit, absorb, and/or process (for example, by modulating, attenuating, or amplifying) IR light at wavelengths between about 1250 nm and 1600 nm, or at wavelengths between about 1300 nm and 1400 nm. As was already alluded to above, in substantially any implementation of the device the layered structure 304 of the display is devoid of (does not have) a cut-out or notch, thereby causing the functional layer 324 and the display layer 304 to be substantially congruent, congruous, spatially fitting one another.

As mentioned, device 300 may have other components and circuitry that have not been expressly shown in the Drawings, for example, tangible non-transitory storage and control and processing circuitry. Storage, and control and processing circuitry may include storage such as hard disk drive storage, nonvolatile memory (e.g., flash memory or other electrically-programmable-read-only memory configured to form a solid-state drive), volatile memory (e.g., static or dynamic random access-memory), and the like. Processing circuitry in storage and processing circuitry may be used to control the operation of device 300. This processing circuitry may be based on one or more microprocessors, microcontrollers, digital signal processors, baseband processors, power management units, audio codec chips, application specific integrated circuits, display driver integrated circuits, and the like.

Storage and processing circuitry may be used to run computer program code on device 300 such as that governing an operation of an internet browsing application, a voice-over-internet-protocol (VOIP) telephone call application, an email applications, a media playback application, an operating system function, and the like. The appropriate computer program codes may be used to implement control operations such as image acquisition operations using a camera, ambient light measurements using an ambient light sensors, proximity sensor measurements using a proximity sensor, information display functions implemented using status indicators such as light emitting-diode status indicators, touch event measurements using a touch sensor, functions associated with displaying information on multiple (e.g., layered) displays, operations associated with performing wireless communications functions, operations associated with gathering and producing audio signals, control operations associated with gathering and processing button press event data, and other functions in device 300.

Device 300 may have input-output electronic circuitry that may be judiciously configured to allow data to be supplied to device 300 and to allow data to be provided from device 300 to external devices. Input-output circuitry may include sensors. Sensors may include ambient light sensors, light-based and capacitive proximity sensor, touch sensors (e.g., light-based touch sensors and/or capacitive touch sensors that are part of a touch screen display or that are implemented using stand-alone touch sensor structures), accelerometers, and other sensors. Some of these sensors may be infrared-based sensors, operating at wavelengths between about 1100 nm and 1600 nm.

Display 304 is similar to display 204 in FIG. 2 and may include an array of touch sensors (i.e., display 304 may be a touch screen). The touch sensors may be capacitive touch sensors formed from an array of transparent touch sensor electrodes such as indium tin oxide (ITO) electrodes or may be touch sensors formed using other touch technologies (e.g., acoustic touch, pressure-sensitive touch, resistive touch, and optical touch).

Audio components may be used to provide device 300 with audio input and output capabilities. Examples of audio components that may be included in device 300 include speakers, microphones, buzzers, tone generators, and other components for producing and detecting sound.

Communications circuitry may be used to provide device 300 with the ability to communicate with external equipment. Communications circuitry may include analog and digital input-output port circuitry and wireless circuitry based on radio-frequency signals and/or light. Wireless circuitry in communications circuitry may include radio-frequency transceiver circuitry, power amplifier circuitry, low-noise amplifiers, switches, filters, and antennas. Wireless communications circuitry in circuitry may, for example, include circuitry for supporting near field communications (NFC) by transmitting and receiving nearfield-coupled electromagnetic signals. For example, communications circuitry (not shown) may include a near field communications antenna and a near field communications transceiver. Communications circuitry may also include a cellular telephone transceiver and antennas, wireless local area network transceiver circuitry and antennas, etc.

Device 300 may also include a battery, power management circuitry, and other input-output devices. Input-output devices may include buttons, joysticks, click wheels, scrolling wheels, touch pads, keypads, keyboards, cameras, light-emitting diodes and other status indicators.

A user can control the operation of device 300 by supplying commands through input-output circuitry and may receive status information and other output from device 300 using the output resources of input-output circuitry.

The infrared electronic components of an embodiment of the invention include semiconductor materials that have material structure(s) that facilitates emitting, absorbing, and/or processing infrared light in a desired wavelength range. As known to a skilled artisan, a material that absorbs light at a given wavelength is also capable of emitting light at that wavelength under appropriate circumstances. As known to a skilled artisan, for operation at wavelengths shorter than about 1000 nm, silicon may be used as an absorber of light. Light emitters of an embodiment of the invention may be formed from materials such as AlGaAs, InGaAs, InGaAsP, to name just a few, that are lattice matched or pseudomorphically strained to a GaAs substrate. For example, GaAs quantum well laser structures may be designed to produce light at wavelengths of approximately 850 nm, while InGaAs quantum well laser structures may be designed to produce light at wavelengths between about 900 nm and 1000 nm (for example, at 940 nm). For infrared devices or components of an embodiment that operate at wavelengths beyond about 1000 nm (such as, for example, between about 1250 nm and 1600 nm), semiconductor materials for absorption, emission and processing of light include InGaAs materials that may be lattice-matched or pseudomorphically strained to an InP substrate, or dilute nitride materials such as GaInNAs, GaInNAsSb, GaNAsSb, GaInNAsBi, GaInNAsSbBi, GaNAsBi and GaNAsSbBi that may be lattice matched or pseudomorphically strained to a GaAs substrate. Alternatively, or in addition, and in a related implementation, InAs—InGaAs quantum dots may also be used to form a light-emitting, -absorbing or -processing layers within the infrared electronic components.

Devices or components operating at infrared wavelengths between about 1250 nm and 1600 nm can be used to further improve the operation of the device 300, as the transparency of the display 302 may be higher at these wavelengths than it is as shorter infrared wavelengths below 1250 nm. The skilled artisan will also appreciate that the choice of operational spectral region from about 1250 nm to about 1600 nm would result in less (reduced) background optical noise or interference from the display devices that operate in the visible wavelength range between about 380 nm and 750 nm (as compared with optical noise or interference produced by devices operating at infrared wavelengths shorter than about 1000 nm). Accordingly, in the so-configured embodiment(s) the need for using additional optical filters (that may be selective to visible and/or infrared wavelengths) may be reduced and/or negated or removed, in comparison with the devices of related art. Additionally, the infrared components may be operated simultaneously with the display elements, without interference, due to the spectral separation between the visible wavelengths generated by the display and the infrared wavelengths used by the infrared components.

In related embodiments, the signal-to-noise ratios (SNRs) are improved (that is, increased) by operating the device at infrared wavelengths spectrally-close to the atmospheric water absorption bands (such as wavelengths close to 1380 nm, for example within a spectral range between about 1350 nm and 1400 nm, or between about 1360 nm and 1390 nm), particularly for outdoor applications where they may be increased background noise due to presence of abundant sunlight. Furthermore, in an embodiment of the invention no physical openings may be required and/or present in the display layer of the device to effectuate the transmission of light at such infrared wavelengths. Notably, the eye-safe power levels at wavelengths from about 1250 nm to about 1600 nm are higher than those for shorter infrared wavelengths (in particular, those shorter than about 1000 nm), thus allowing for implementation of safer devices, or devices capable of providing operational functionality at longer distances. For example the eye safe radiant power at the wavelengths from about 1250 nm to about 1600 nm is about 100 times higher than that at 940 nm, so a spatial range of operation can be extended to up to about 10 times as compared to that of devices operating at 940 nm.

Currently-provided by related art facial recognition solutions that utilize IR wavelengths below 1000 nm are known to operate at distances shorter than about 1 m from the target, such as between about 25 cm and 75 cm from the target. Devices that—according to the idea of the invention—are configured to make use of light at wavelengths beyond 1250 nm can operate more safely over such distances (in particular, such devices can operated at higher power levels that those of related art.) Since higher power levels can now also be used, the implementations of the invention can also extend the operational range of functions to distances beyond 1 m, such as up to distances of about 5 m, or up to about 10 m, or up to 20 m, allowing further functionality such as scene illumination, recognition, identification or evaluation.

In one case, the infrared camera 308 may include an array of detection elements arranged as pixels (by analogy with the arrangement in a focal plane array), configured to receive and detect light, and optical elements such as lens elements and optical filters. The light-sensitive element of the infrared camera 308 includes a semiconductor material chosen to absorb light at infrared wavelengths, between about 1100 nm and 1600 nm. (In a related example, such infrared camera is configured to detect light at wavelengths between about 1250 nm and 1600 nm.) Examples of semiconductor materials that may be used to manufacture infrared camera 308 include InGaAs lattice-matched to an InP substrate, germanium (Ge), silicon-germanium (SiGe), and dilute nitride materials such as GaInNAs, GaInNAsSb, GaNAsSb, GaInNAsBi, GaInNAsSbBi, GaNAsBi and GaNAsSbBi lattice matched to a GaAs substrate. Examples of dilute nitride infrared detectors and arrays are described in co-pending Patent Application PCT/US18/52873, filed on 26 Sep. 2018, the entire disclosure of which is incorporated herein by reference. Other non-limiting examples of materials and devices capable of operating at wavelengths between about 1100 nm and 1600 nm silicon surface plasmon Schottky detectors, hyperdoped silicon (such as silver-doped silicon Si:Ag), germanium-on-insulator devices, silicon devices that have been sensitized using solution-processed nanocrystalline quantum dots, and quantum dots. Examples of quantum dot and nanocrystalline quantum dot materials include PbS, InAs, InGaAs, InP, PbSe, CdS, CdSe, ZnS (CdSe), ZnSe(CdS), ZnSe(PbS), PbO(PbS) and $PbSO_4$ (PbS). The individual pixel size and spacings between the pixels are judiciously dimensioned to correspond to (spatially match) those of the transparent regions of display pixels 304A of overlying display 304.

In one implementation, the flood illuminator 310 may be structured to include an array of light emitters (or light-emitting apertures) that, in operation, deliver an IR optical illumination beam towards the display layer 304. The flood illuminator 310 may include not only the array of light emitters, but the corresponding electronic driving circuitry and auxiliary optical elements (such as one or more lens elements). Examples of light emitters that may be used in an embodiment of the flood illuminator 310 include vertical-cavity surface-emitting lasers (VCSELs), edge-emitting semiconductor lasers, resonant cavity light emitting diodes (RCLEDs), and superluminescent diodes (SLDs). A given flood illuminator may, for example, include an array of VCSELs that in operation produces an array of output spots of light with regular spacings among the spots, which spacings correspond to the dimensions and spatial locations of the transparent regions of pixels 304A of the overlying display 304. In some embodiments, the VCSEL array may be formed using constituent VCSELs fabricated from dilute nitride semiconductor materials and capable of emitting light at wavelengths between about 1250 nm and 1600 nm. Examples of dilute nitride materials include GaInNAs, GaInNAsSb, GaNAsSb, GaInNAsBi, GaInNAsSbBi, GaNAsBi and GaNAsSbBi. Examples of dilute nitride semiconductor laser and VCSEL devices are described in U.S. Pat. No. 6,798,809 and in U.S. Pat. No. 7,645,626, the disclosure of each of which is incorporated herein by reference.

Alternatively or in addition, and in one specific case, the proximity sensor 312 may be structured to include at least one of light emitter, optical detector, and additional optical element (such as a lens element and a waveguide and a filter), and be configured to detect the proximity of a user to the device 300 as well as, optionally, gestures or expressions of the user. Light reflected from the user holding the device 300 may be detected and appropriately processed with the use of the sensor 112 and the corresponding programmable processor to determine a separation distance between the user and the device 300, as well as gestures from the user. One non-limiting example of a proximity sensor is described in U.S. Pat. No. 7,728,316, the disclosure of which is incorporated herein by reference. At least one light emitter of the proximity sensor 312 may be a VCSEL device, an edge-emitting laser, an RCLED, or an SLD, configured to emit light at a wavelength between 1100 nm and 1600 nm (for example, between 1250 nm and 1600 nm). Generally, any optoelectronic sensing element operably associated with the proximity sensor 312 is configured to absorb light at such a wavelength.

In one implementation, the dot projector 320 of the device 300 is structured to include an array of light emitters (light-emitting apertures) configured to produce a pattern of light (referred to interchangeably as structured light) that may be appropriately used for user's facial recognition and/or gesture recognition. Dot projector 320 may include not only such an array of light emitters, but also the corresponding electronic driving circuitry and/or auxiliary optical elements (such as a lens element and/or a waveguide and/or a diffractive optical element that diffracts out the light emitted by the corresponding light emitter). In particular, the dot projector is configured to produce an overall output spatial distribution of light (or dot pattern) with a desired number of dots and dot spacings, which may be regular or irregular, depending on a particular implementation. Examples of light emitters that may be used in a dot projector 320 include arrays of VCSELs, arrays of edge emitting semiconductor lasers, RCLEDs and SLDs. One example of a dot projector device is described in U.S. Pat. No. 10,054,430, the disclosure of which is incorporated herein by reference. Examples of VCSEL arrays that may be used for structured light generation are also described in a co-pending International Patent Application PCT/US20/12771, the disclosure of which is incorporated herein by reference. In some embodiments, the dot projector 320 may include an array of VCSEL devices fabricated from dilute nitride semiconductor materials. Alternatively, or in addition, the dot projector 320 may be configured to have a size of the output spot of light and spacing(s) between the output spots of light that corresponds to respective dimensions of the transparent regions of display pixels 304A of the overlying display layer 304. Light output of the dot projector 320 that is reflected from an object may be appropriately detected and processed with the optical detection unit of the device 300 and the corresponding programmable processor (not shown) and used for applications such as facial recognition and gesture recognition.

In one implementation, the infrared electronic components may form a time-of-flight sensor, including at least one light emitter or an array of light emitters as a light illumination source, and at least one light detector or an array of light detectors. A time-of-flight sensor may be employed in such implementation for proximity sensing and/or facial recognition, and/or scene illumination, recognition, identification or evaluation, and/or gesture recognition.

It is understood, therefore, that each of the individual infrared electrical components 308, 310, 312 and 320 is preferably spatially aligned with corresponding transparent regions of display pixels 304A of the display layer 304.

Figure 4A:
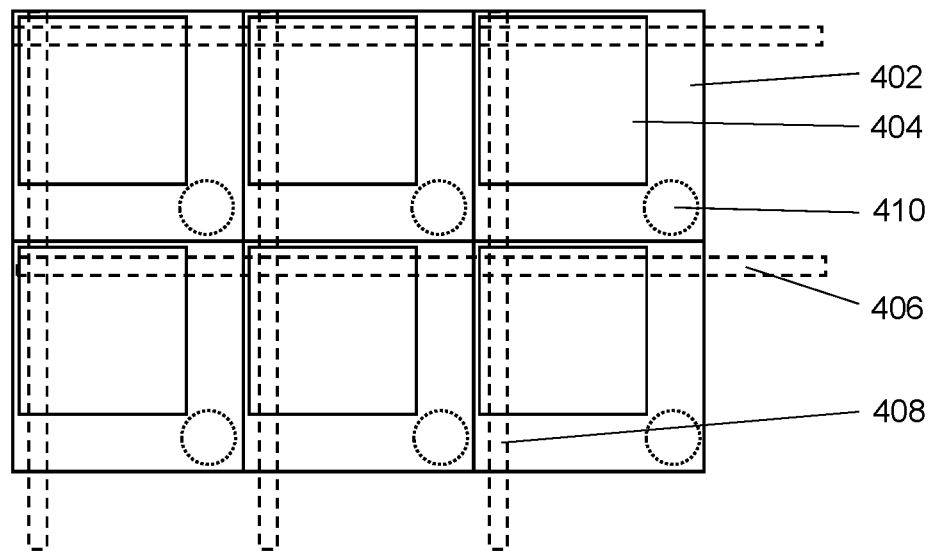
FIG. 4A presents a top view for a display pixel array and underlying infrared components.

FIG. 4A is a schematic top view of a portion of a specific example of the implementation of a device with the display 400. This device as shown has multiple pixels 402 in the display 400 and multiple infrared components 410 underlying (in reference to the general schematic of FIG. 3) the pixels 402. Display pixels 402 are preferably formed on a display substrate made from the appropriate optical material. A given display pixel 402 may have an optically-active area 404, within the geometrical bounds of the pixel 402, where the optically active area emits light, in operation of the display, in a wavelength range that is, in one case, visible to a user (between about 400 nm and about 700 nm). (As used in this disclosure, and unless expressly defined otherwise, an optically active area of a pixel in a display refers to and identifies a portion of the pixel that emits light and that may then form an element of a display visually-perceivable by the viewer in such emitted light. Typically, the wavelengths of light emitted by the optically active area are, therefore, in the visible wavelength range, although a conversion of light can be employed with the use of a layer of a phosphorescent or fluorescent material applied to the optically-active area. Conversely, the areas that is not optically active—the non-optically-active areas—are not configured to emit light and do not emit light in operation of the display.) Both the pixels 402 and the corresponding optically-active areas 404 of the display 400 are shown schematically as having square shapes, but it will be understood that differently-shaped pixel structures (for example, those shaped rectangularly or hexagonally) may also be used. A given optically-active area 404 may be structured to include an emissive layer (or layers) or regions configured to emit red and/or green and/or blue and/or white light. The fill factor for the pixel is defined by the ratio of the optically-active area to the total pixel area (which, in turn, is defined as the sum of the active and inactive areas of a given pixel). The optically-active area may be formed with the use of an LEDs, micro-LED, OLED, TOLED, a plasma cell, an electronic ink element, an LCD component, or another suitable display pixel structure. The optically-active area may also have other auxiliary layers or regions that are overlying and/or underlying the emissive layer. These auxiliary layers may include an electrode (an anode and/or a cathode), a carrying substrate, a thin film device, and an encapsulant or sealant material.

For example, in a specific embodiment where the display pixels are configured as OLEDs, the substrate for the display layers may be formed from a thin sheet of material such as a thin glass layer (e.g. Corning Willow® glass) or a flexible polyimide layer or a sheet of other polymer material. Thin-film devices may be constructed on the substrate. The thin-film devices may include thin-film circuitry such as thin-film transistors (e.g., polysilicon and/or amorphous silicon transistors), conductive interconnects (e.g., interconnect lines formed from patterned metal, pattered indium tin oxide or other patterned transparent conductive materials, or other conductive structures), and other functional electronic circuitry. Organic light emitting material and structures may be additionally formed on top of the thin-film devices. Such organic layers may include an electron transport layer (ETL), an emissive layer, an electron blocking layer (EBL), a hole transport layer (HTL) and a hole injection layer (HIL), configured such that light may be emitted under an electrical bias. An encapsulating layer (such as layer of sealant) may be added to encapsulate (to make fluidly sealed from the environment) and protect the layer of organic light-emitting material and other underlying structures of the display 400.

The inactive optical area (that is, the non-optically-active area) of pixel 402 (that is shown in FIG. 4A as the area, within the bounds of the pixel 402, that is adjoining and/or surrounding the active area 404) may support and/or carry the electronic connection circuitry, shown in straight dashed lines, for rows (dashed lines 406) and for columns (dashed lines 408) of pixels of the display 400. Such electronic connection circuitry may include electrically-conducting members such as traces of metallic material and be judiciously configured to not only provide the energy required to power various components and/or elements of the device but also, in at least on embodiment, transmit signals representing operational performance of such components and/or elements to dedicated sensor(s) (not shown). The inactive optical areas of the display pixels 402 may be made transparent to the IR radiation at a target wavelength. (Notably, in substantially any implementation discussed in this disclosure, the transparent region of a given non-optically-active or optically inactive area of the display may be dimensioned to be either congruent with one another or incongruent with one another). In this case, the optical element 410 (such as a laser source and/or an optical detector) disposed in spatial cooperation with and under the inactive optical area of the pixel remains, nevertheless, optically accessible through the display layer. In this specific example, the infrared components 410 are shown schematically with dashed lines as having generally circular geometries although it will be understood that the infrared components 410 may be dimensioned differently—for example, an infrared component may have a circular geometry, a rectangular geometry, or a hexagonal geometry, to name just a few, as required by the configuration of a specific component.

The example of display 400 of FIG. 4A is shown to include a regularly-spaced array of pixels 402, each having a rectangular boundary, and a regularly-spaced array of respectively-corresponding infrared component in a corresponding rectangular configuration. However, it will be understood that other regularly-spaced array configurations (such as a hexagonal array in one non-limiting example) may also be used. The display 400 is also shown in this specific example to possess the same spatial periodicity for the pixel array as that for the array of underlying infrared components. However, different spatial grids (periods) may be employed in practice, so long as the infrared components are placed under the optically-transparent regions of the pixels 402 of the display 400. Moreover, while the array 400 shows one infrared component 410 per pixel 402, it will be understood that generally at least one infrared component (and, possibly, a plurality of such components) may be spatially cooperated with a given pixel in a chosen region of the display, provided that the at least one infrared component is spatially aligned with a transparent region of the display.

Figure 4B:
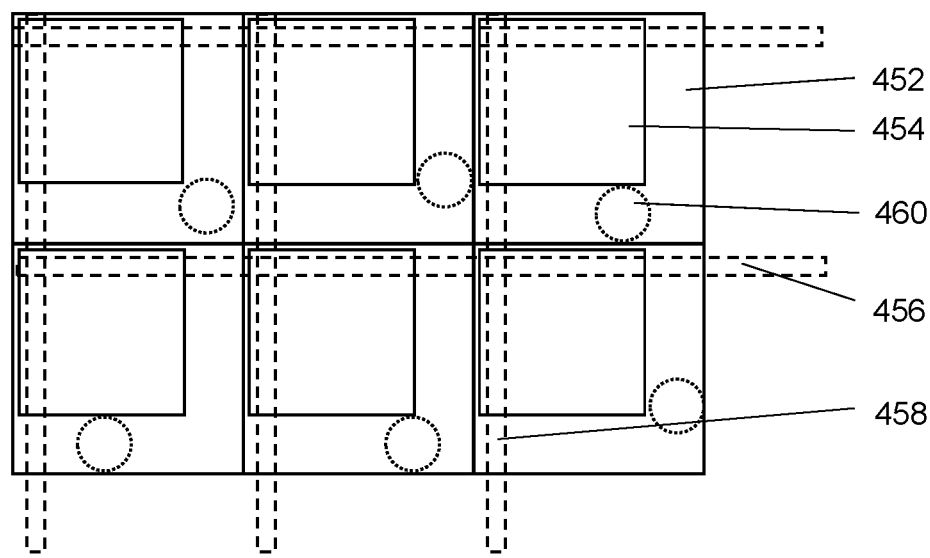
FIG. 4B shows a top view for a display pixel array and underlying infrared components.

In reference to FIG. 4B, a top view of a portion of an example of a related device with the display 450 is shown. The display 450 includes multiple pixels 452 with optically-active areas 454, and multiple (display-layer-) underlying infrared components 460. The embodiment 450 is similar to the embodiment 400 of FIG. 4A, except that the array of pixels in each embodiment is chosen to be spatially-regular and the array of infrared components 460 of the embodiment 450 is chosen to be spatially-irregular (such that the spacings between adjacent infrared optical components generally differ from one another, while at the same time ensuring that each infrared component 460 is disposed under a corresponding transparent region of the respective pixel 452 of the display 450).

Figure 5A:
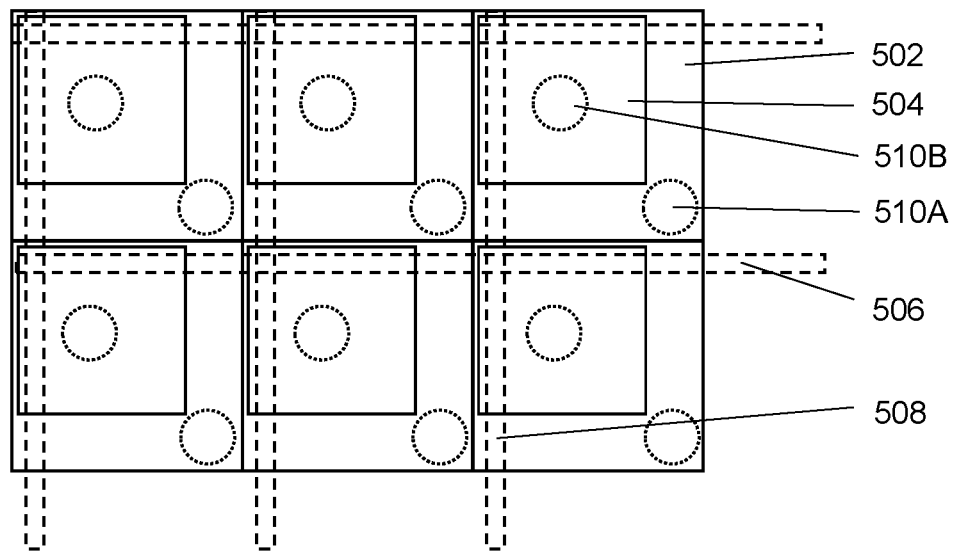
FIG. 5A is a top view for a display pixel array and underlying infrared components.

FIG. 5A illustrates schematically a top view of a portion of an embodiment of display 500 having multiple pixels 502, organized in a spatially-regular array, with optically active regions 504 and multiple display-layer-underlying infrared components (510A and 510B). The embodiment 500 is similar to the embodiment 400, except that some of the multiple infrared optical components (shown as 510B) are placed under the respectively-corresponding optically active pixel areas, and some other of the multiple infrared components (shown as 510A) are disposed under the transparent inactive pixel areas. In some embodiments utilizing, for example, OLEDs where transparent electrical contacts (anode and cathode) are used and where underlying thin film devices are small, the optically-active pixel areas may also be configured to be transparent to light at infrared wavelengths (for example, as in a TOLED), to allow more readily the possibility for multiple infrared components (510B and 510A) to be placed and operated the under transparent regions of pixels 502 within the display.

Figure 5B:
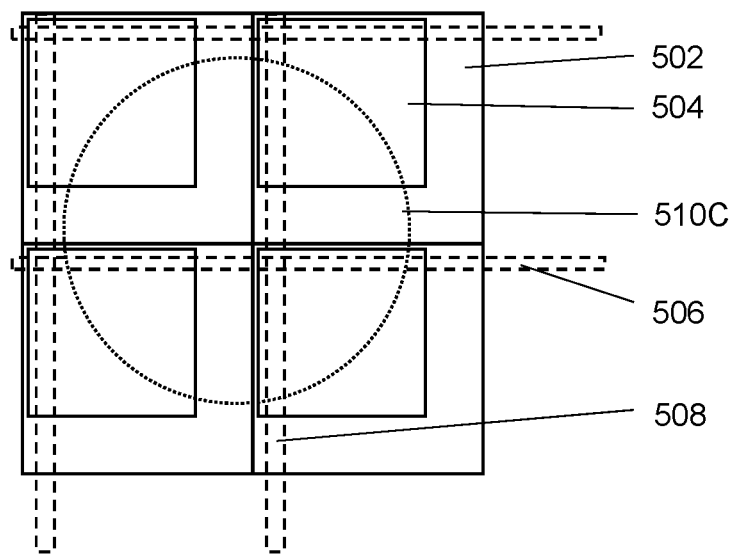
FIG. 5B is a top view for a display pixel array and underlying infrared components.

FIG. 5B illustrates schematically a top view of a portion of an embodiment of display 550, structured according to a related embodiment, in which multiple pixels 502 are organized in a spatially-regular array, with optically active regions 504 and display-layer-underlying infrared component 510C, such as a photodetector or a photodetector array or a laser array, where the area of a given infrared component 510C is larger than the area of a single pixel 502. (In this case, is results in a specific spatial coordination of various elements of the display, where the projection of the area of the infrared component 510C onto the plane of the display overlaps with projections of areas of at least two optically-active areas onto the same plane. Such plane, in FIG. 5B, is represented by the plane of the drawing itself.) Therefore, the embodiment 550 is similar to the embodiment 500, except that the infrared optical component 510C underlies multiple pixels 502 of the display. Such situation is realized in a case when a single photodetector employed in an embodiment of the device of the invention has an operational clear aperture diameter of about 300 µm, or when an employed VCSEL array has a size of up to approximately 1.2 mm by 1.2 mm, while a display pixel is dimensioned to be about 50 µm.

Figure 6:
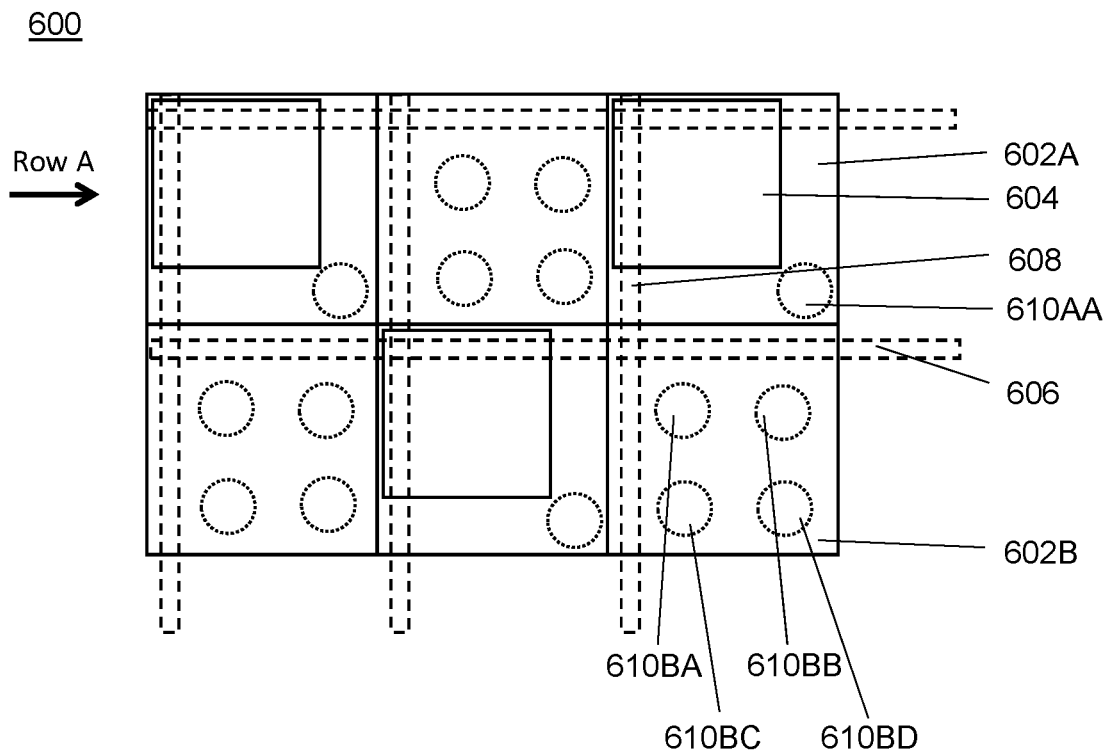
FIG. 6 shows a top view for a display pixel array and underlying infrared components.

FIG. 6 provides an additional illustration of a top view of a portion of another example of the display 600. The embodiment 600 of the display is similar to the embodiment 400, except that display 600 has rows and/or columns of two different pixel types 602A and 602B, the optically-active areas of which are arranged in a "checkered pattern". In this case, in a given row (shown, for example, as "row A" in FIG. 6), pixels 602A containing both optically-active and non-optically-active areas are alternative with pixels 602B that contain only non-optically-active area. In some embodiments, other pixel arrangements may also be used (for example, a given row can be formed from the type X and type Y pixels arranged according to the sequence "XXYXXYXXY . . . ", or a sequence "XYYXYYX-YY . . . ", or a sequence "XXXYYYXXXYYY . . . ", to name just a few).

Referring again to FIG. 6, pixel 602A is structurally-similar to pixels 402, 452, and 502, and has an active optical area 604 surrounded by an optically-inactive region that is transparent to light at chosen infrared wavelengths. An infrared component 610AA may optionally be placed under the pixel 602A. However, in examples where the pixel fill-factor is very high, or where the pixel size is very small (so as to allow higher resolution displays), the surface area of the transparent region in the display may be substantially limited, which in turn may prevent the desired spatial cooperation/alignment of a given infrared component under the corresponding pixel. For example, a square pixel 602A with a dimension of 50 µm and a fill factor of 50% would have an active optical area 604 with of approximately 35 µm by 35 µm, leaving a 15 µm wide strip that may accommodate an infrared optical component 610AA. However, for a pixel dimension of 30 µm and a fill factor of 50%, the active area dimension is 21 µm, which provides a strip of width 9 µm, or in a pixel with fill factor of 60%, the active area dimension is 24 µm, which provides a strip of width 6 µm. Unless a transparent OLED (TOLED) architecture is used, this limits the size and location of an infrared component that may be placed under the pixels of a display. An infrared component, for example, a light source such as a single VCSEL, may have an output aperture size as low as about 4 µm to make the geometry of this IR component be compatible with the geometry of the overlying pixel of the display. Such dimensioning also allows an array of IR devices or components to be formed under the display, each of such components underlying a transparent region of the display pixels.

Pixel 602B is similar to pixel 602A, except that in some embodiments, as illustrated, it does not have an optically active area. Consequently, a far larger portion of the pixel 602B (less any area associated with electrical interconnects 606 and 608) can be transparent to IR light of interest, and can be used in examples where the pixel size is smaller and/or the pixel fill factor for pixels such as 602A is larger, reducing the available space in pixel 602A where an underlying infrared component may be placed. In some embodiments, pixel 602B can have no optically active area or a smaller optically active area (not shown) than the optically-active area 604 of pixel 602A. The use of pixel 602B, with either no optically-active area at all or a reduced (as compared with the pixel 602A) optically-active area, increases the overall available transparent area of the display, under which infrared electronic components may be placed in practice. At least one IR electronic component, such as an infrared light source or an infrared detector, may be disposed under pixels 602B in the display 600. In the example shown, each of the four infrared components 610BA, 610BB, 610BC and 610BD is spatially-coordinated with the transparent pixel 602B to be within the boundaries of the transparent pixel 602B. The display embodiment 600 is shown as having interleaved regular pixels 602A and transparent pixels 602B. The interleaved arrangement may be chosen to be utilized over a region of the display that is large enough to accommodate embedded infrared components behind the display, with the optically-emissive pixels 602A used across the remainder of the display. While the embodiment 600 is shown to possess a spatially-regular arrangement of four infrared components 610BA, 610BB, 610BC and 610BD, it will be understood that different numbers of infrared components, different types of infrared components (such as light emitters and light detectors), and irregular arrangements for the infrared components may also be used. It will also be understood that pixel arrangements other than an interleaved arrangement may also be used. For example, transparent pixels 602B may be arranged in spatially adjacent locations, such as two adjacent pixels or a 2-by-2 array of adjacent pixels, in order to accommodate arrangements of infrared components.

Figure 8:
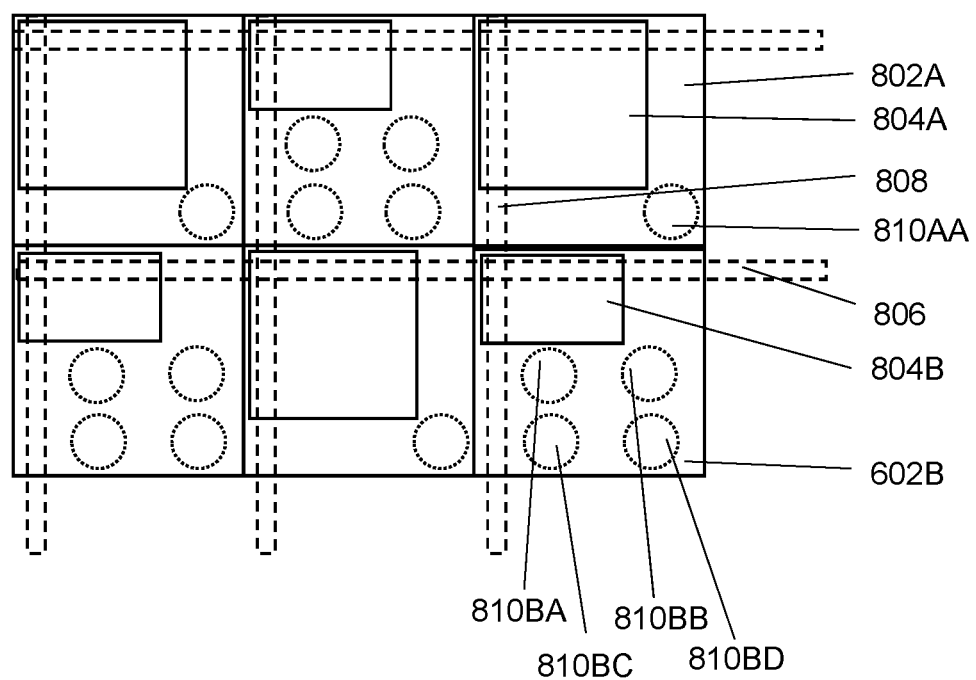
FIG. 8 is a top view for a display pixel array and underlying infrared components.

FIG. 8 provides an additional illustration of an implementation of the idea of the invention. Here, a top view of a portion of another example of a display 800 is shown. The embodiment 800 is structurally-similar to the embodiment 600, except whereas pixel type 602A has an optically active area 604 and pixel type 602B has no optically-active area, pixel type 802A has an optically active area 804A and pixel type 802B has an optically-active area 804B. Here, the optically active areas of different pixels are different in size and, in particular, the optically active area 804B is smaller than the optically active area 804A.

The resolution of displays and the associated pixel density in related industry is increasing, with pixel densities of approximately 500 pixels per inch (ppi) possible, which amounts to pixel sizes of about 50 μm by 50 μm, and with even higher pixel density predicted. The ever-increasing spatial density of the pixels raises challenges during the manufacture of corresponding displays. In advantageous contradistinction with the related art, in regions of a display that, in embodiments of the invention, are structured to overlay the corresponding IR electronic components, the pixel density and the associated display resolution can be decreased or reduced in the overlying region from the corresponding maximum values of density and resolution while otherwise maintaining the operational characteristics of the display. For example, interleaving transparent pixels and regular display pixels, as shown in the embodiment 600, can be used to reduce the active display pixel count approximately by half. However, as will be readily appreciated by a skilled artisan, different interleaving patterns may also be used that provide adequate transparency for the underlying infrared components while decreasing the display pixel count (and hence spatial resolution of a given display) by a different amount. Consequently, in some embodiments, the resolution of the display in the region overlying the infrared components may be lesser that the resolution elsewhere in the display but is still sufficient to provide acceptable levels of display resolution, the resolution changes being small or imperceptible. For example, as shown in FIG. 6, the active pixel density is reduced in half. For a pixel dimension of 25 μm, in a given row or a column, there would still be an active pixel every 50 μm for the portion of a display overlying infrared components, providing a similar resolution level to a display having a 50 μm pixel size. The infrared components may have dimensions up to a few millimeters, such as 5 millimeters, while a display for a smart phone may have a dimension of at least 4 inches (or 10 centimeters), thus any change in resolution is limited to only a small portion of the display device, and typically at a periphery of the display device.

Figure 7:
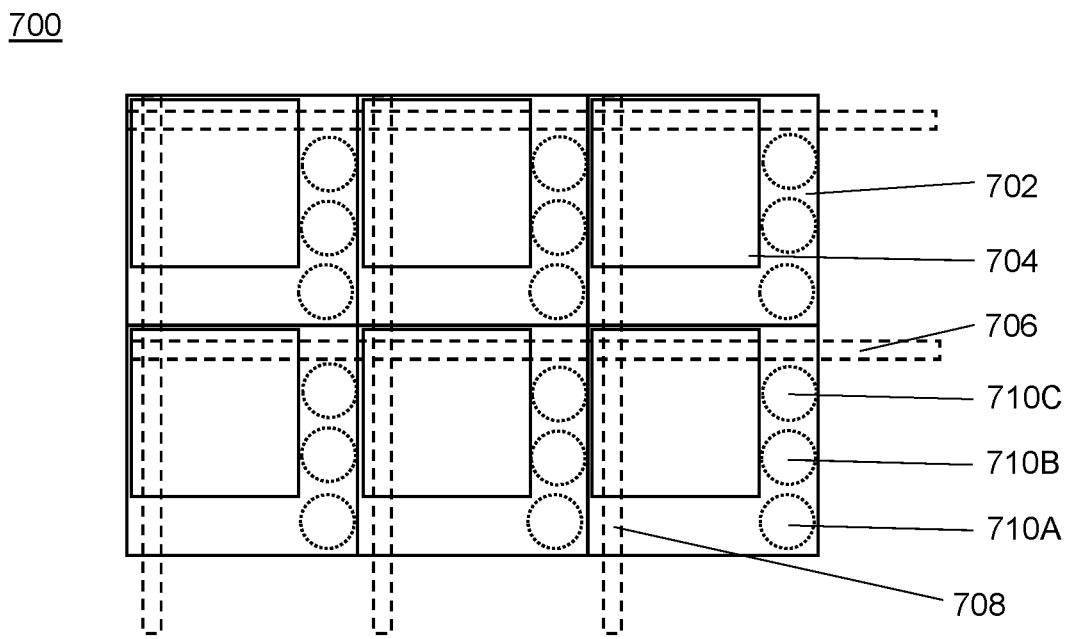
FIG. 7 illustrates a top view for a display pixel array and underlying infrared components.

Generally, a VCSEL may have an output aperture size between about 4 μm and 30 μm. An array of VCSELs may include a plurality of VCSELs with a pitch or spatial separation of the VCSEL apertures between about 25 μm and about 150 μm, or between about 30 μm and about 60 μm, or between about 40 μm and 50 Photodetectors may have aperture sizes between about 6 μm and about 500 μm, such as about 30 μm or about 50 μm or about 300 μm. Where the laser (or detector) aperture size is less than or equal to a width of a transparent region of a display pixel, a laser array, or a photodetector array, or an interleaved array of photodetectors and lasers may be aligned with the transparent areas, as shown in FIG. 7. Display device 700 is similar to display device 400 shown in FIG. 4A, having multiple pixels 702, each with an optically-active area 704 within the geometrical bounds of the pixel 702, and electronic connection circuitry, shown in straight dashed lines, for rows (706) and for columns (708) of pixels of display 700. Optical elements 710A, 710B and 710C are disposed in spatial cooperation with and under the inactive optical area of the pixel and remain optically addressable through the display area. Notably, the group of optical elements shown as 710A, 710B, and 710C may include only optical detectors, only light emitters, or a combination (for example, an array) of spatially-interleaved optical detectors and light emitters. In this specific example, the infrared components 710A, 710B and 710C are shown schematically with dashed lines as having circular geometries although it will be understood that the infrared components 710A, 710B and 710C may be dimensioned differently—for example, an infrared component may have a circular geometry, a rectangular geometry, or a hexagonal geometry, to name just a few, as required by the component(s). Both the pixels 702 and the corresponding optically-active areas 704 are shown schematically as having square shapes, but it will be understood that differently-shaped pixel structures (for example, those shaped rectangularly or hexagonally) may also be used.

Where the infrared electronic component size is larger than the width or dimension of the non-active (transparent) region of a pixel, or where the size of an array of infrared electronic components is larger than the size of the non-active region of a pixel, the infrared electronic component(s) may also underlie the pixel active area, if the pixel is designed to be optically transparent at infrared wavelengths (FIG. 5), or it may underlie a pixel such as pixel 602B in FIG. 6, where the pixel has no optically-active area at all, or it may underlie a pixel such as pixel 802B in FIG. 8, where the pixel has a reduced optically active area (as compared with the pixel 802A). Generally, infrared components in substantially any embodiment are configured to operate at wavelength(s) ensuring minimal—if any—cross-talk between and among the infrared components and/or to have operational wavelengths in the range from about 1100 nm and 1600 nm.

Example 1 An Embodiment with a VCSEL Array Behind a Display

In reference to FIG. 4A: An active matrix OLED (AMO-LED) display with a resolution of 458 ppi has a pixel size approximately 55 µm by 55 µm, and may have a fill-factor of approximately 50%, providing a 16 µm wide non-emissive area for each pixel, which is transmissive to infrared light at a wavelength of about 1370 nm. A VCSEL flood illuminator component of the embodiment is formed using a 10-by-10 array of VCSELs having aperture sizes of about 10 microns (generally—between about 8 µm and about 15 µm). The VCSELs are formed on a GaAs wafer and include dilute nitride quantum well active regions and are configured to emit light at a wavelength of about 1370 nm. The VCSEL array of 10 elements by 10 elements is designed with a pitch (or aperture spacing) of about 55 µm to match the overlying display, thereby allowing each VCSEL of the array to be spatially aligned with a transparent region of the overlying pixel of the display. As a result, the complete VCSEL array is disposed under the 10-by-10 pixel array of the display pixels. The chip size for the flood illuminator component is chosen to be about 800 µm by 800 µm. In a related embodiment, to form a display screen with resolution of 326 ppi, the display pixel size is about 78 µm, and an 11 by 11 array of VCSELs designed to match the display has a size of about 1 mm by 1 mm. Such arrangements may be implemented in an embodiment 300 of FIG. 3 as well, alongside other desired electronic components described for device 300. The infrared components may be operated simultaneously with the display, or at different times to the display according to a desired mode of operation or a user's inputs.

Example 2 Sensor with a VCSEL and a Detector Placed Behind a Display

In reference to FIGS. 2 and 3: A sensor includes a single dilute-nitride VCSEL emitter with a 12 µm diameter aperture, operating at a wavelength of about 1380 nm, and a dilute nitride infrared photodetector (with a clear aperture diameter of about 300 microns) sensitive to such light at 1380 nm (for example, a photodetector with a dilute nitride absorber having a bandgap of 0.82 eV). Both infrared components are placed under a transparent OLED display that has a resolution of 500 ppi, which has a display pixel size of about 50 µm by 50 µm. The detector underlies an array of 6×6 display pixels, while the VCSEL may be placed behind another display pixel. In operation, the VCSEL emitter emits a light signal (through the display) that is incident on a target and is reflected back towards the detector behind the display. Such arrangements may be implemented in device 300 in FIG. 3, alongside other desired electronic components described for device 300. The infrared components may be operated simultaneously with the display, or at different times to the display according to a desired mode of operation or a user's inputs.

The invention as recited in claims appended to this disclosure is intended to be assessed in light of the disclosure as a whole, including features disclosed in prior art to which reference is made.

For the purposes of this disclosure and the appended claims, the use of the terms "substantially", "approximately", "about" and similar terms in reference to a descriptor of a value, element, property or characteristic at hand is intended to emphasize that the value, element, property, or characteristic referred to, while not necessarily being exactly as stated, would nevertheless be considered, for practical purposes, as stated by a person of skill in the art. These terms, as applied to a specified characteristic or quality descriptor means "mostly", "mainly", "considerably", "by and large", "essentially", "to great or significant extent", "largely but not necessarily wholly the same" such as to reasonably denote language of approximation and describe the specified characteristic or descriptor so that its scope would be understood by a person of ordinary skill in the art. In one specific case, the terms "approximately", "substantially", and "about", when used in reference to a numerical value, represent a range of plus or minus 20% with respect to the specified value, more preferably plus or minus 10%, even more preferably plus or minus 5%, most preferably plus or minus 2% with respect to the specified value. As a non-limiting example, two values being "substantially equal" to one another implies that the difference between the two values may be within the range of +/−20% of the value itself, preferably within the +/−10% range of the value itself, more preferably within the range of +/−5% of the value itself, and even more preferably within the range of +/−2% or less of the value itself. The term "substantially equivalent" may be used in the same fashion.

The use of these terms in describing a chosen characteristic or concept neither implies nor provides any basis for indefiniteness and for adding a numerical limitation to the specified characteristic or descriptor. As understood by a skilled artisan, the practical deviation of the exact value or characteristic of such value, element, or property from that stated falls and may vary within a numerical range defined by an experimental measurement error that is typical when using a measurement method accepted in the art for such purposes.

Although specific examples of embodiments have been illustrated and described herein, it will be appreciated by those of ordinary skill in the art that any arrangement that is calculated to achieve the same purpose may be substituted for the specific embodiments shown. For example, in substantially any embodiment an overall area of the at least one of the pixels may be defined by a combination of said non-optically-active area and said optically-active area (that is, the optically-active and non-optically-active areas of a given display pixel are complementary to one another, in aggregate forming the overall area of the at least one of the pixels).

The scope of the invention is intended to cover any adaptations or variations of embodiments of the present invention. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description. The scope of the present invention includes any other applications in which embodiment of the above structures and fabrication methods are used. The scope of the embodiments of the present invention should be determined with reference to claims associated with these embodiments, along with the full scope of equivalents to which such claims are entitled.

What is claimed is:

1. An electronic device-comprising:
   a housing;
   at least one infrared component in the housing, wherein the at least one infrared component comprises a dilute nitride semiconductor material; and
   a pixelated display layer in optical communication with the at least one infrared component, the pixelated display layer comprising an array of pixels and having at least one transmissive region, the at least one transmissive region including a material of the pixelated display layer that is substantially transparent to infrared light,
   wherein the at least one transmissive region is spatially coordinated with the at least one infrared component such that the at least one infrared component detects or emits the infrared light through the material of the pixelated display layer at the at least one transmissive region, the infrared light having a wavelength between 1100 nm and 1600 nm.

2. The electronic device according to claim 1, wherein at least one of the following conditions is satisfied: a) the display further comprising a polymer substrate, a glass substrate, or a silicon substrate configured to carry the array of pixels thereon, and b) wherein the infrared light is traversing the material of the pixelated display layer while being transmitted between a medium at the front and the at least one infrared component through the at least one transmissive region.

3. The electronic device according to claim 1, wherein at least one pixel of the array of pixels includes a non-optically-active area and wherein the non-optically-active area is substantially congruent with the at least one transmissive region.

4. The electronic device according to claim 1, further comprising a transparent protection layer,
   wherein at least one pixel of the array of pixels further comprises an optically-active area, and wherein the optically-active area is located between the transparent protection layer and the at least one infrared component.

5. The electronic device according to claim 4, wherein an overall area of the at least one of the pixel of the array of pixels is defined by a combination of a non-optically-active area and the optically-active area.

6. The electronic device according to claim 1, wherein the at least one infrared component comprises a semiconductor laser or an optical detector.

7. The electronic device according to claim 1, wherein the at least one infrared component comprises an array of vertical-cavity surface-emitting lasers (VCSELs).

8. The electronic device according to claim 1, wherein the at least one infrared component further comprises an auxiliary optical element.

9. The electronic device according to claim 1, wherein the at least one infrared component includes at least one of an infrared optical camera, a flood illuminator, a dot projector, a time-of-flight sensor, and a proximity sensor.

10. The electronic device according to claim 1, wherein the at least one infrared component is included in multiple infrared components, the multiple infrared components configured to operate at the wavelength.

11. The electronic device according to claim 1, wherein the wavelength of the infrared light is between 1250 nm and 1600 nm.

12. The electronic device according to claim 1, wherein the infrared light traverses the material of the array of pixels when the at least one infrared component detects or emits the infrared light.

13. The electronic device of claim 1, wherein the dilute nitride semiconductor material includes at least one of: GaInNAs, GaInNAsSb, GaNAsSb, GaInNAsBi, GaInNAsSbBi, GaNAsBi, and GaNAsSbBi.

14. A method for fabricating an electronic device, the method comprising:
   providing a transparent protection layer of the electronic device;
   forming a first layered structure of the electronic device, the first layered structure defining a display pixel and including:
      an optically-active portion of the display pixel; and
      a non-optically-active portion of the display pixel, wherein the non-optically-active portion is configured to not emit light when the display pixel is operating,
      wherein the non-optically-active portion includes a material of the first layered structure that is substantially transparent to infrared light;
   constructing a functional layer of the electronic device by disposing an array of infrared components, the first layered structure located between the array of infrared components and the transparent protection layer, wherein the array of infrared components comprises a dilute nitride semiconductor material and detects or emits infrared light having a wavelength between 1100 nm and 1600 nm through the material of the pixelated display layer at the non-optically-active portion;
   creating a second layered structure carrying electronic connection circuitry electrically connected to at least one of the first layered structure and the functional layer;
   disposing the functional layer and the first layered structure in and within bounds of a housing shell such that the non-optically-active portion is positioned between at least one of the array of infrared components and the transparent protection layer.

15. The method according to claim 14, wherein at least one of the following conditions is satisfied:
   (i) wherein the forming the first layered structure includes dimensioning the non-optically-active portion to be transparent to the infrared light; and
   (ii) wherein the constructing the functional layer includes constructing the functional layer to include at least one of an infrared camera, a flood illuminator, a proximity sensor, a dot projector, a speaker, a microphone, and an optical camera.

16. The method according to claim 14, wherein at least one of the following conditions is satisfied:
   (i) wherein the forming the first layered structure includes defining both the optically-active portion and the non-optically-active portion within predetermined boundaries of the display pixel without overlapping thereof;
   (ii) wherein forming the first layered structure includes dimensioning the optically-active portion and the non-optically-active portion to be complementary to one another to define, aggregately, an overall area of the display pixel;
   (iii) wherein the forming the first layered structure includes forming a first display pixel and a second display pixel in the first layered structure, the first display pixel having both of corresponding optically-active and non-optically-active portions, the second display pixel having only a corresponding non-optically-active portion; and (iv) wherein the forming the first layered structure includes forming an array of the display pixels in the first layered structure, in which the optically-active portions of the array of the display pixels are formed with a first spatial period, wherein the array of infrared components are disposed with a second spatial period; and wherein the first and second spatial periods substantially coincide.

17. The method according to claim 14, wherein at least one of the following conditions is satisfied:

(i) wherein the disposing the functional layer includes disposing the array of infrared components such that each of the array of infrared components is positioned behind the non-optically-active portion, as seen from the front; and (ii) wherein the disposing the functional layer includes disposing the array of infrared components such that each of the array of infrared components is positioned behind the optically-active portion, as seen from the front.

18. The method according to claim 14, wherein the forming includes forming the first layered structure having a first area, wherein the constructing includes constructing the functional layer that includes a second area, and wherein the first and second areas are substantially congruent or spatially matching one another.

19. The method according to claim 14, further comprising configuring the array of infrared components to operate at the wavelength without cross-talk.

* * * * *